United States Patent [19]

Tanaka et al.

[11] Patent Number: 4,680,792
[45] Date of Patent: Jul. 14, 1987

[54] DEMODULATOR COMPRISING AN INDICATOR CIRCUIT FOR USE IN COMMON TO CANCELLATION OF A PILOT SIGNAL AND AN INDICATION OF A RECEPTION STATE

[75] Inventors: Kouichi Tanaka; Takeshi Kuwajima; Kiyoshi Amazawa, all of Tokyo, Japan

[73] Assignees: NEC Corporation; Clarion Co., Ltd., both of Tokyo, Japan

[21] Appl. No.: 708,454

[22] Filed: Mar. 5, 1985

[30] Foreign Application Priority Data

Mar. 5, 1984 [JP] Japan .................................. 59-41614

[51] Int. Cl.⁴ .............................................. H04H 5/00
[52] U.S. Cl. .......................................... 381/12; 381/13
[58] Field of Search ........................... 381/4, 11, 12, 13

[56] References Cited

U.S. PATENT DOCUMENTS

| | | | |
|---|---|---|---|
| 4,037,165 | 7/1977 | Ogita | 381/4 |
| 4,076,963 | 2/1978 | Fujie et al. | 381/4 |
| 4,166,925 | 9/1979 | Ienaka | 381/11 |
| 4,300,020 | 11/1981 | Toyomaki | 381/4 |

Primary Examiner—Forester W. Isen
Attorney, Agent, or Firm—Sughrue, Mion, Zinn, Macpeak & Seas

[57] ABSTRACT

In a demodulator comprising an indicator (31) for indicating either stereo reception or monaural reception, an indicator circuit (30) is used to cancel a pilot signal included in a stereophonic signal and to produce a drive signal for driving the indicator. The indicator circuit comprises a negative feedback loop formed by an adder circuit (41), a phase detector (43), and a cancellation circuit (45). The cancellation circuit supplies the indicator and the adder circuit with the drive signal and a cancelling signal synchronized with and approximate to the pilot signal, respectively. The adder circuit substracts the cancelling signal from the pilot signal to deliver an intermediate signal to a multiplex decoder and to the cancellation circuit through the phase detector. The cancellation circuit comprises a wave generator for generating a pair of currents proportional to an amplitude of the pilot signal and a level adjusting circuit for converting one of the currents into the cancelling signal. The other current is converted into the drive signal.

6 Claims, 6 Drawing Figures

DEMODULATOR COMPRISING AN INDICATOR CIRCUIT FOR USE IN COMMON TO CANCELLATION OF A PILOT SIGNAL AND AN INDICATION OF A RECEPTION STATE

BACKGROUND OF THE INVENTION

This invention relates to a demodulator operable in response to either of a stereophonic signal and a monophonic or monaural signal to demodulate one of the stereophonic and the monophonic signals into a demodulated or audio signal. Each of the stereophonic and the monophonic signals is subjected to frequency modulation. In particular, the stereophonic signal is given in the form of a composite signal comprising, in addition to a pilot signal of a predetermined frequency, for example, 19 kHz, a main channel and a subchannel signal carrying a right and a left signal.

As will later be described with reference to a few figures of the accompanying drawing, a conventional demodulator of the type described is supplied as an input signal with either a stereophonic signal or a monophonic signal and comprises a phase-locked loop circuit for producing a frequency signal necessary for demodulation of the input signal and a decoder for decoding the input signal into the audio signal with reference to the frequency signal. When the stereophonic signal is received as the input signal, the pilot signal should be cancelled from the audio signal. For this purpose, a pilot signal cancellation circuit is coupled between the phase-locked loop circuit and the decoder.

Furthermore, an indicator is included in the demodulator to indicate reception of the stereophonic signal. In general, the indicator is lit or illuminated when the pilot signal is detected from the stereophonic signal and, otherwise, the indicator is darkened. In the conventional demodulator, the indicator is driven by an indicator drive circuit independent of the phase-locked loop, the pilot signal cancellation circuit, and the decoder. This means that the conventional demodulator is intricate in structure because of presence of a superfluous circuit, such as the indicator drive circuit.

In addition, it has been a recent trend that the demodulator is mounted in a wide variety of audio receivers, such as a high fidelity audio receiver, a portable audio receiver, an audio receiver on vehicle. As a rule, the indicator for each radio receiver is lit by the use of the indicator drive circuit by a driving signal of a level peculiar to each radio receiver. As a result, the indicator drive circuits should be changed from one another for various uses. This is because the driving signal level can not be changed in the conventional demodulator.

SUMMARY OF THE INVENTION

It is an object of this invention to provide a demodulator which is simple in structure.

It is another object of this invention to provide a demodulator of the type described, which is readily applicable to a wide variety of audio receivers.

It is still another object of this invention to provide a demodulator of the type described, wherein a driving signal level can readily be changed for purposes of the demodulator.

A demodulator to which this invention is applicable is for use in producing a demodulated signal in response to one of a stereophonic signal accompanied by a pilot signal of a predetermined frequency and a monophonic signal accompanied by no pilot signal. The demodulator comprises intermediate signal producing means responsive to the one of the stereophonic and the monophonic signals and a local input signal for producing an intermediate signal and demodulating means for demodulating the intermediate signal into the demodulated signal. According to this invention, the demodulator comprises cancelling signal producing means responsive to a signal related to the one of the stereophonic and the monophonic signals for producing a cancelling signal and a drive signal dependent on the cancelling signal when the one of the stereophonic and the monophonic signals is the stereophonic signal. The cancelling signal has the predetermined frequency. The demodulator further comprises means for supplying the cancelling signal to the intermediate signal producing means as the local input signal and indicator means responsive to the drive signal for indicating presence of the pilot signal.

DESCRIPTION OF THE PREFERRED EMBODIMENTS

Figure 1:
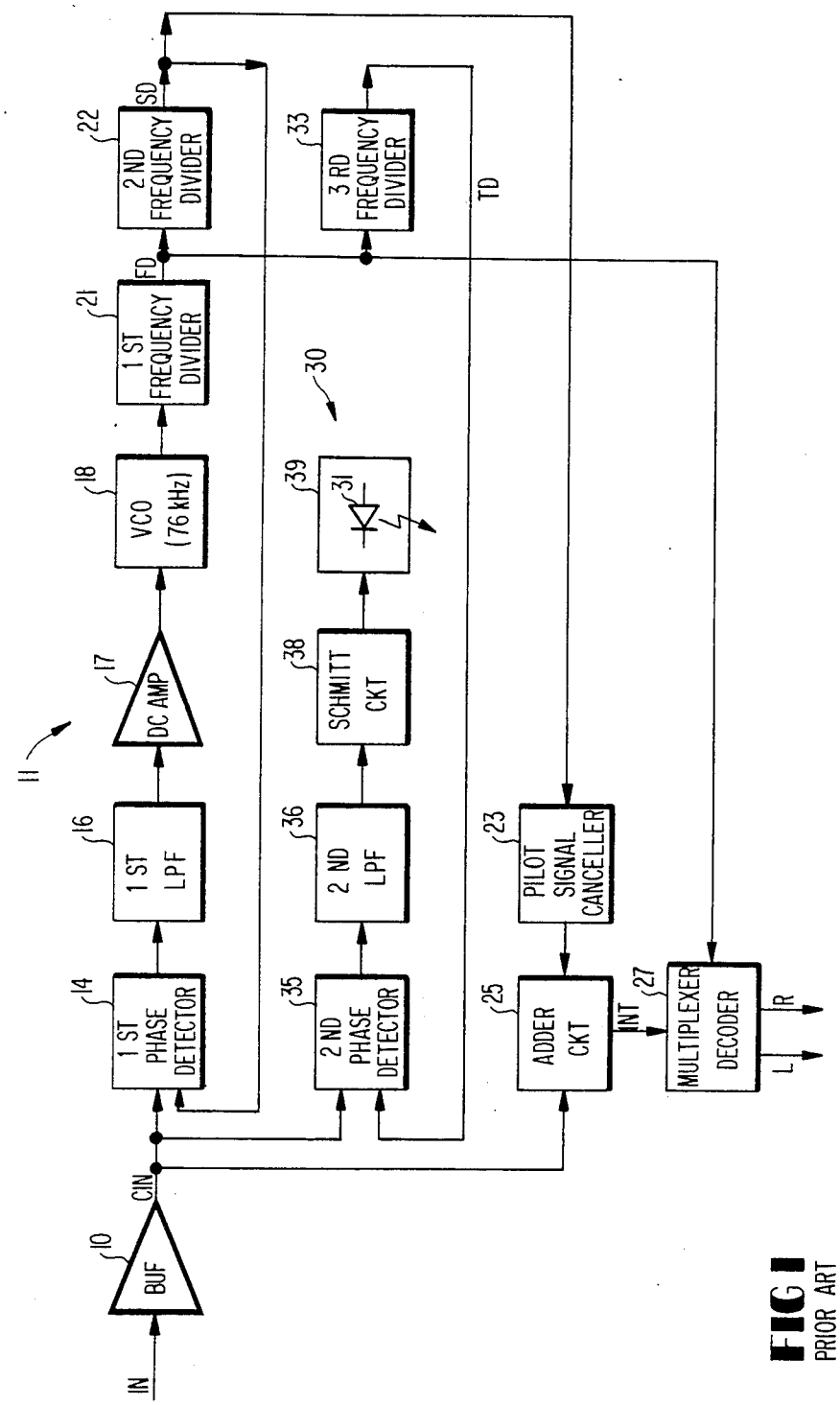
FIG. 1 is a block diagram of a conventional demodulator.
Figure 2:
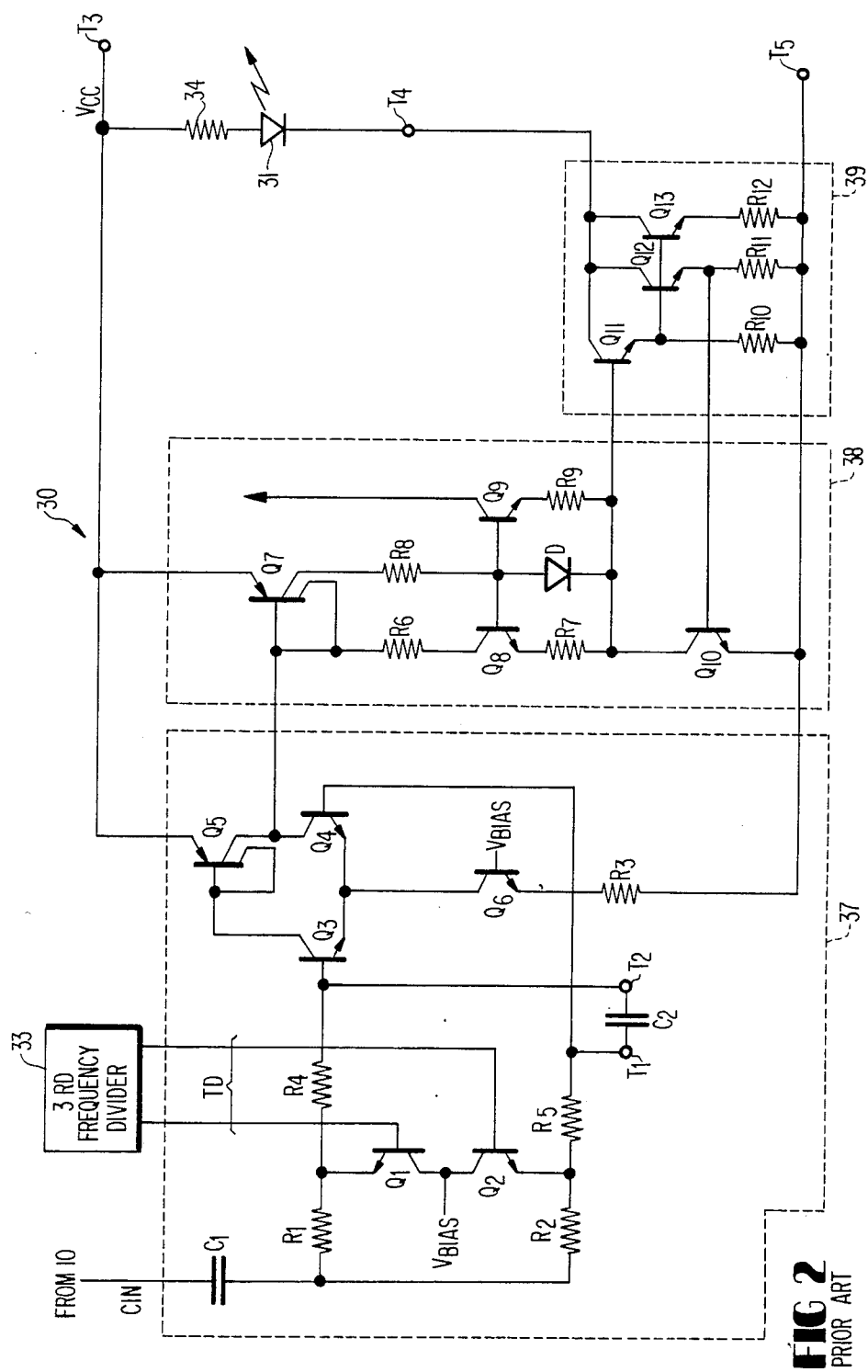
FIG. 2 is a circuit diagram for use in describing in detail a part of the conventional demodulator illustrated in FIG. 1.

Referring to FIGS. 1 and 2, a conventional demodulator will be described for a better understanding of this invention. In FIG. 1, the demodulator is supplied as an input signal IN with either a stereophonic signal accompanied by a pilot signal of 19 kHz or a monophonic signal accompanied by no pilot signal. The input signal IN may be called a system input signal. The stereophonic signal comprises main channel and subchannel signals both of which carry a right signal component and a left signal component as is well known in the art.

The system input signal IN is delivered through a buffer amplifier 10 as a circuit input signal CIN to a phase-locked loop (often abbreviated to PLL) circuit 11 operable in a known manner. Like the system input signal IN, the circuit input signal CIN is either the stereophonic signal or the monophonic signal. The phase-locked loop circuit 11 comprises a first phase detector 14, a first low-pass filter (LPF) 16, a d.c. amplifier 17, and a voltage controlled oscillator (VCO) 18 for generating an oscillation signal of 76 kHz controlled by an output signal of the d.c. amplifier 17. Responsive to the oscillation signal, a first frequency divider 21 of a factor of two divides the oscillation signal frequency by the factor of two to produce a first frequency divided signal FD of 38 kHz. The first frequency divided signal FD is supplied to a second frequency divider 22 having a factor of two and is divided into a second frequency divided signal SD of 19 kHz by the second frequency divider 22. The second frequency divided signal SD will be called a first local frequency signal and is sent back to the first phase detector 14. The first phase detector 14 detects a phase difference between the input signal IN and the second frequency divided signal SD to produce a phase difference signal representative of the phase difference. The phase difference signal is sent through the first low-pass filter 16 and the d.c. amplifier 17 to the voltage controlled oscillator 18 as the output signal of the amplifier 17. As a result, the second frequency divided signal SD is phase matched with the input signal IN. Anyway, the second frequency divided signal SD appears in response to the system input signal IN. The second frequency divider 22 and the second frequency divided signal SD may be called a first frequency generator and a first local frequency signal, respectively.

As readily understood from the above, the second frequency divided signal SD is coincident in frequency and phase with the pilot signal included in the stereophonic signal. The pilot signal should be suppressed on demodulation of the stereophonic signal. For this purpose, a pilot signal canceller 23 is supplied with the second frequency divided signal SD to produce a cancelling signal which is synchronized with the pilot signal and which may be a substantial reproduction of the pilot signal.

The input signal IN is also delivered through the buffer amplifier 10 to an adder circuit 25 responsive to the cancelling signal supplied from the pilot signal canceller 23. The adder circuit 25 subtracts the cancelling signal from the input signal to produce an intermediate signal INT. The adder circuit 25 may be named an intermediate signal circuit. The subtraction of the cancelling signal from the input signal results in a sufficient suppression of the pilot signal. Accordingly, the pilot signal is suppressed in the intermediate signal INT. The intermediate signal INT is supplied from the adder circuit 25 to a multiplex decoder 27 to be decoded into the right signal component depicted at R and the left signal component depicted at L with reference to the first frequency divided signal FD.

In FIGS. 1 and 2, the circuit input signal CIN is delivered from the buffer amplifier 10 to an indicator circuit 30 for driving an indicator which may be a light emitting diode, namely, a photo diode 31. The indicator circuit 30 is operable in response to the circuit input signal CIN and coupled to a third frequency divider 33 having a factor of two. The third frequency divider 33 produces a third frequency divided signal TD in response to the first frequency divided signal FD of 38 kHz. The third frequency divided signal TD therefore has a frequency of 19 kHz and is different in phase from the second frequency divided signal SD by $\pi/2$. Specifically, the third frequency divided signal D are sent from the third frequency divider 33 to the indicator driving circuit 30 in the form of a pair of pulse successions which are antiphase relative to each other. The third frequency divided signal TD and the third frequency divider 33 may be called a second local frequency signal and a second local frequency divider, respectively.

As shown in FIG. 2, the indicator circuit 30 has first, second, third, fourth, and fifth external terminals $T_1$, $T_2$, $T_3$, $T_4$, and $T_5$. The third external terminal $T_3$ is connected to a power source (not shown) to provide a source voltage $V_{cc}$ while the fifth external terminal $T_5$ is grounded. The photo diode 31 is connected across the third and the fourth external terminals $T_3$ and $T_4$ through a resistor 34.

The indicator circuit 30 illustrated in FIGS. 1 and 2 comprises a second phase detector 35 responsive to the circuit input signal CIN and the third frequency divided signal TD and a second low-pass filter 36 which is depicted together with the second phase detector 35 in a single block 37 in FIG. 2. In FIG. 2, the second phase detector 35 is composed of a first capacitor $C_1$, first through fifth transistors $Q_1$ to $Q_5$, and first through third resistors $R_1$ to $R_3$ while the second low-pass filter 36, fourth and fifth resistors $R_4$ and $R_5$ and a second capacitor $C_2$ connected across the first and the second external terminals $T_1$ and $T_2$. The first and the second transistors $Q_1$ and $Q_2$ are alternatingly turned on and off in response to the pulse succession pair given as the third frequency divided signal TD from the third frequency divider 33 to bases of the first and the second transistors $Q_1$ and $Q_2$.

On the other hand, emitters of the first and the second transistors $Q_1$ and $Q_2$ are supplied with the circuit input signal CIN through the first capacitor $C_1$ and each of the first and the second resistors $R_1$ and $R_2$. As a result, a phase difference is detected by the first and the second transistors $Q_1$ and $Q_2$ between the circuit input signal CIN and the third frequency divided signal TD and developed across bases of the third and the fourth transistors $Q_3$ and $Q_4$ through the third low-pass filter 36 on reception of the pilot signal in a manner to be described. The third and the fourth transistors $Q_3$ and $Q_4$ are operable as a differential amplifier to produce an amplifier output signal corresponding to the phase difference.

The amplifier output signal is supplied to a Schmitt circuit 38 comprising seventh through tenth transistors $Q_7$ to $Q_{10}$, sixth through ninth resistors $R_6$ to $R_9$, and a diode D. At any rate, the Schmitt circuit 38 has a threshold level, as known in the art. When the amplifier output signal has a level higher than the threshold level, an output signal is sent from the Schmitt circuit 38 to a drive circuit 39 comprising eleventh through thirteenth transistors $Q_{11}$ to $Q_{13}$ and tenth through twelfth resistors $R_{10}$ to $R_{12}$.

Let the pilot signal be absent from the circuit input signal CIN owing to reception of the monophonic signal or be not detected as yet despite of reception of the stereophonic signal because phase synchronism is not established. In this event, the third transistor $Q_3$ is continuously turned on while the fourth transistor $Q_4$ is therefore kept off. Accordingly, the photo diode 31 is kept dark to indicate monaural reception because the Schmitt circuit 38 and the drive circuit 39 are inactive. Further, when the pilot signal is very weak in spite of establishment of the phase synchronism and the amplifier output signal is not higher in level than the threshold level of the Schmitt circuit 38, the Schmitt circuit 38 is kept intact without inversion of the output signal of the Schmitt circuit 38. The photo diode 31 is not lit like on the monaural reception.

When the level of the amplifier output signal becomes higher than the threshold level of the Schmitt circuit 38 on reception of the stereophonic signal, the output signal of the Schmitt circuit 38 is inverted to drive the photo diode 31 to an on state. When the output signal exceeds a switching or lightening level of the photo diode 31, the photo diode 31 is switched on and lit to indicate stereo reception.

The above-mentioned indicator circuit 30 is formed in a semiconductor chip by an integration technique. Each transistor occupies a predetermined area on the semiconductor chip.

It is to be noted here that operation, namely, the switching level of the photo diode 31 is fixedly determined by an area ratio between the third and the fourth transistors $Q_3$ and $Q_4$ and by the threshold level of the Schmitt circuit 38. The area ratio between the third and the fourth transistors $Q_3$ and $Q_4$ and the threshold level can not be changed once the indicator circuit 30 is designed and formed into the semiconductor chip.

It may be possible to change the switching level of the photo diode 31 by connection of any external elements connected through superfluous external terminals in addition to the external terminals, such as $T_1$ to $T_5$. However, it is undesirable to increase such superfluous external terminals in an integrated circuit.

Figure 3:
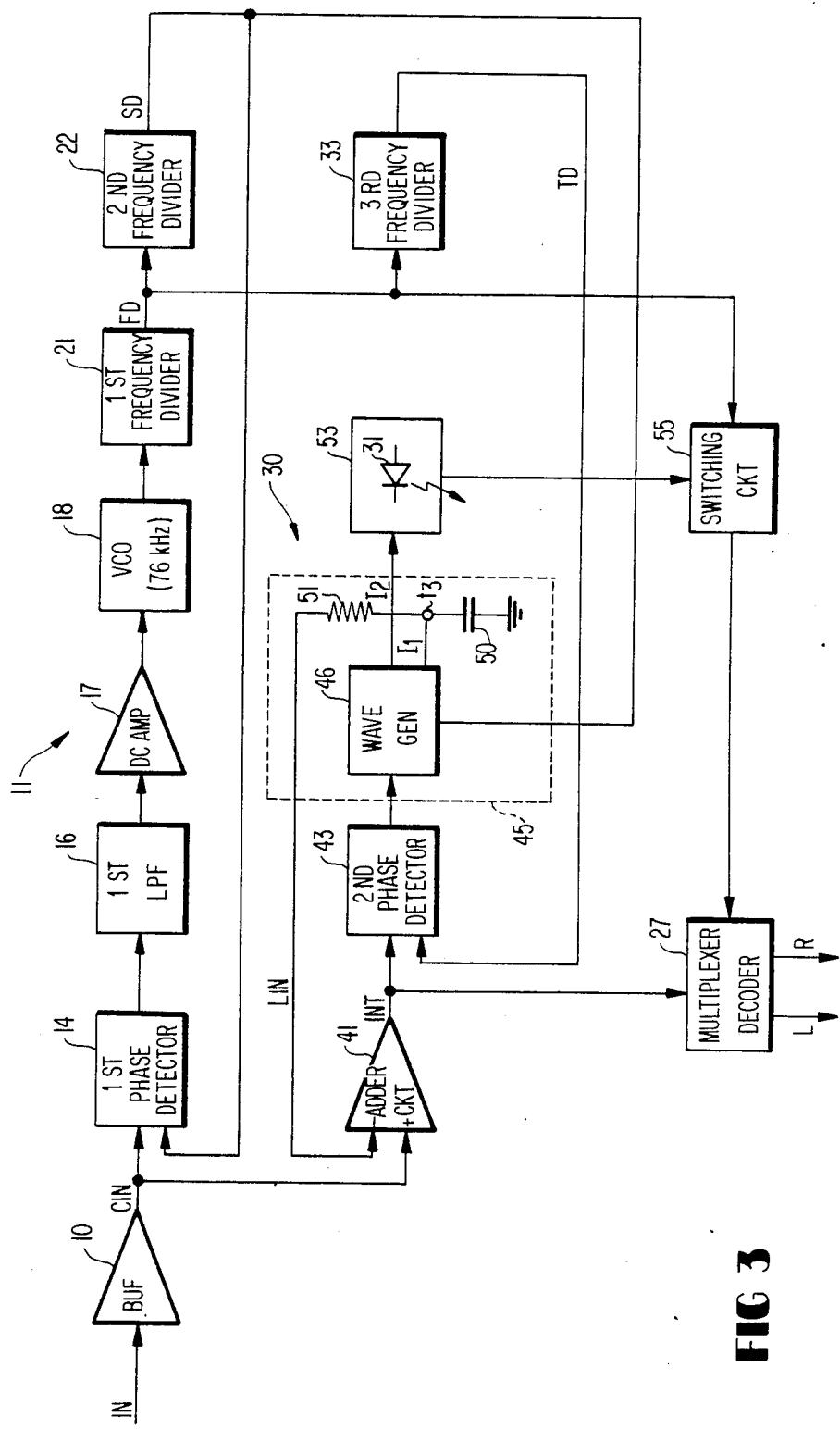
FIG. 3 is a block diagram of a demodulator according to a preferred embodiment of this invention.
Figure 4:
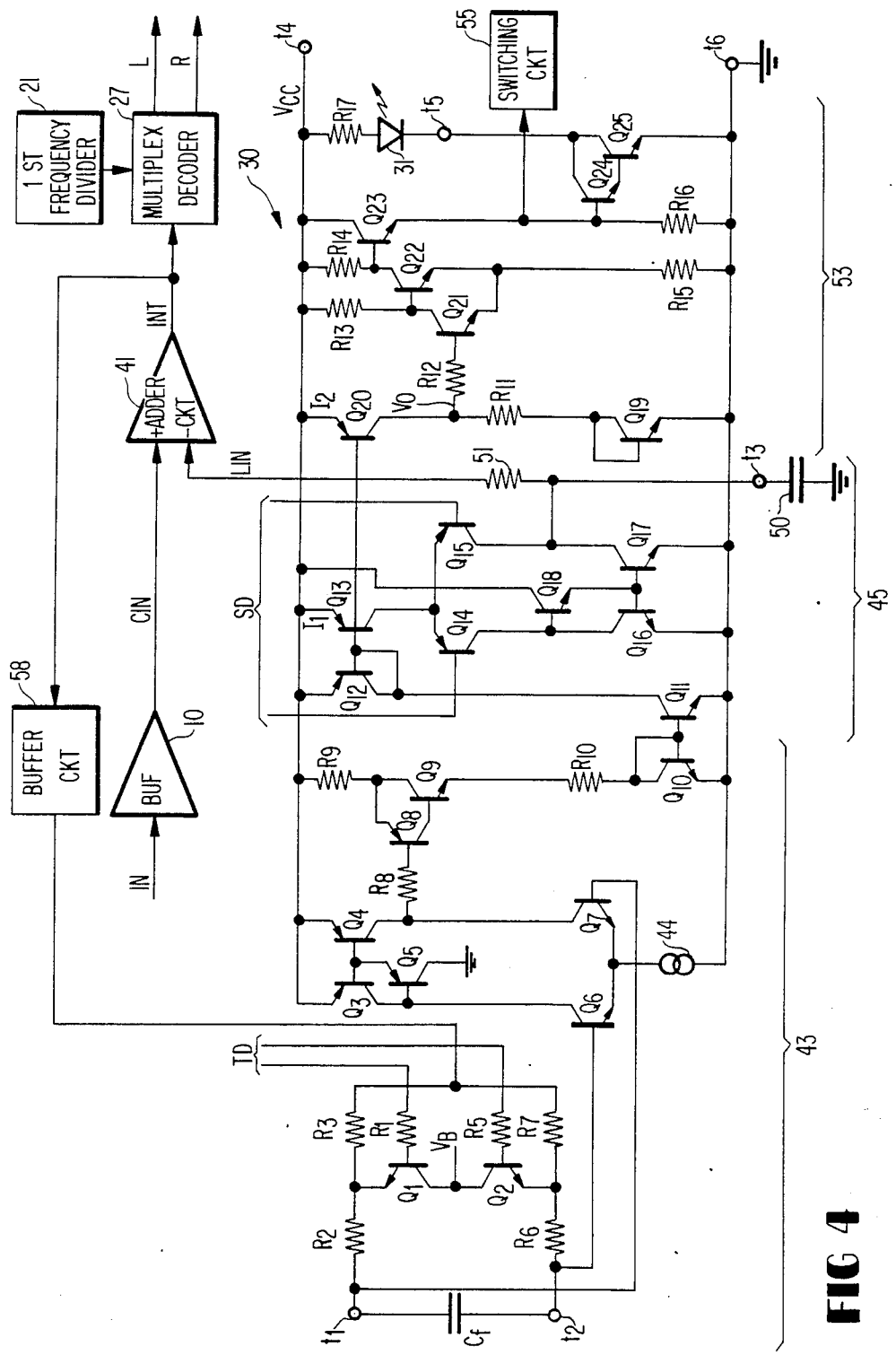
FIG. 4 is a circuit diagram of an indicator circuit illustrated in FIG. 3.

Referring to FIGS. 3 and 4, a demodulator according to a preferred embodiment of this invention comprises similar parts designated by like reference numerals. In FIG. 3, it is to be noted that the indicator circuit 30 is not separated from the multiplex circuit 27 but is coupled to the multiplex decoder 27. In other words, the illustrated indicator circuit 30 is operable to drive the indicator symbolized by the photo diode 31 and to cancel the pilot signal on reception of the stereophonic signal in a manner to be described later.

More particularly, the indicator circuit 30 comprises first through sixth circuit terminals $t_1$ to $t_6$ as illustrated in FIG. 4. The photo diode 31 is connected across the fourth and fifth circuit terminals $t_4$ and $t_5$ with the fourth circuit terminal $t_4$ supplied with the source voltage $V_{cc}$. The sixth circuit terminal $t_6$ is grounded. The remaining terminals will become clear as the description proceeds. An adder circuit 41 is supplied with the circuit input signal CIN from the buffer amplifier 10. The adder circuit 41 is also supplied with a local input signal LIN as will later be described. It suffices to say that the local input signal LIN appears only on reception of the stereophonic or composite signal and has a frequency of 19 kHz equal to the pilot signal included in the stereophonic signal. The circuit input signal CIN and the local input signal LIN are supplied to positive and negative terminals of the adder circuit 41, respectively, and therefore serve as a subtractor. Consequently, the adder circuit 41 produces an intermediate signal INT from which the pilot signal is suppressed on reception of the stereophonic signal. In this sense, the adder circuit 41 is similar to the adder circuit 25 illustrated in FIG. 1 and may be referred to as an intermediate signal circuit.

The intermediate signal INT is sent to the multiplex decoder 27 and processed in the manner described in conjunction with FIG. 1 to be decoded into the right signal component R and the left signal component L or into a monaural signal. A combination of the right and the left signal components R and L or the monaural signal may be referred to as a demodulated signal.

In FIGS. 3 and 4, a second phase detector 43 is coupled to the adder circuit 41 through a buffer circuit 44 (FIG. 4) and is operable in response to the intermediate signal INT. As shown in FIG. 4, the second phase detector 43 comprises first through tenth circuit transistors $Q_1$ to $Q_{10}$, first through tenth circuit resistors $R_1$ to $R_{10}$, a filter capacitor $C_f$ connected across the first and the second circuit terminals $t_1$ and $t_2$, and a constant current source 44. The first and the second circuit transistors $Q_1$ and $Q_2$ have collectors connected in common to each other, bases supplied with the third frequency divided signal TD through the first and the fifth circuit resistors $R_1$ and $R_5$, respectively, and emitters supplied with the intermediate signal INT through the third and the seventh circuit resistors $R_3$ and $R_7$. The third frequency divided signal TD may be called the second local frequency signal, as mentioned before, and is given as the pulse successions.

The sixth and the seventh circuit transistors $Q_6$ and $Q_7$ have bases connected to the second and the first circuit terminals $t_2$ and $t_1$, respectively, emitters connected through the constant current source 44 to the sixth circuit terminal $t_6$, and collectors connected to a first current mirror circuit comprising the third through fifth circuit transistors $Q_3$ to $Q_5$. A collector of the fourth circuit transistor $Q_4$ is connected through the eighth and the ninth circuit transistors $Q_8$ and $Q_9$ and the tenth circuit resistor $R_{10}$ to the tenth circuit transistor $Q_{10}$ of a diode connection.

A cancellation circuit 45 is connected to the second phase detector 43 as illustrated in FIG. 3. The cancellation circuit 45 comprises a wave generator 46 and a level adjustment circuit. The level adjustment circuit comprises a feedback capacitor 50 and a feedback resistor 51 which is connected between the feedback capacitor 50 and the negative terminal of the adder circuit 41. The feedback capacitor 50 is connected to the third circuit terminal $t_3$ and has a capacitance $C_a$ while the feedback resistor 51 has a resistor $R_a$. More specifically, the cancellation circuit 45 comprises eleventh through eighteenth circuit transistors $Q_{11}$ to $Q_{18}$, as illustrated in FIG. 4. Among others, the eleventh circuit transistor $Q_{11}$ is coupled to the tenth circuit transistor $Q_{10}$ to form a second current mirror circuit while the twelfth circuit transistor $Q_{12}$ of a diode connection is connected to the thirteenth circuit transistor $Q_{13}$ to form a third current mirror circuit. The twelfth circuit transistor $Q_{12}$ is connected to the eleventh circuit transistor $Q_{11}$.

The fourteenth and the fifteenth circuit transistors $Q_{14}$ and $Q_{15}$ have emitters connected in common to the thirteenth circuit transistor $Q_{13}$ and bases supplied with the second frequency divided signal, namely, the first local frequency signal SD having a phase different by $\pi/2$ from the third frequency divided signal TD. The illustrated second frequency divided signal SD is given in the form of a pair of additional pulse successions which are antiphase relative to each other. As a result, the fourteenth and the fifteenth circuit transistors $Q_{14}$ and $Q_{15}$ are alternatingly turned on and off.

A fourth current mirror circuit comprises the sixteenth and the seventeenth circuit transistors $Q_{16}$ and $Q_{17}$ connected to the fourteenth and the fifteenth circuit transistors $Q_{14}$ and $Q_{15}$, respectively, and the eighteenth circuit transistor $Q_{18}$ connected in the illustrated manner.

A collector of the seventeenth circuit transistor $Q_{17}$ is connected to the third circuit terminal $t_3$ and connected through the feedback resistor 51 to the negative terminal of the adder circuit 41.

The wave generator 45 is connected to a drive circuit 53 for driving the photo diode 31. The drive circuit 53 illustrated in FIG. 4 comprises nineteenth through twenty-fifth circuit transistors $Q_{19}$ to $Q_{25}$ and eleventh through seventeenth resistors $R_{11}$ to $R_{17}$. The twentieth circuit transistor $Q_{20}$ is connected to the twelfth circuit $Q_{12}$ to form a fifth current mirror circuit and is also connected through the eleventh circuit resistor $R_{11}$ to the nineteenth circuit transistor $Q_{19}$ of a diode connection.

A point of connection between the twentieth circuit transistor $Q_{20}$ and the eleventh resistor $R_{11}$ is connected to a hysteresis circuit comprising the twenty-first through twenty-third circuit transistors $Q_{21}$ to $Q_{23}$ and the thirteenth through fifteenth circuit resistors $R_{13}$ to $R_{15}$. The hysteresis circuit has a threshold voltage determined by the above-mentioned transistors and resistors.

A combination of the twenty-fourth and the twenty-fifth circuit transistors $Q_{24}$ and $Q_{25}$ and the sixteenth circuit resistor $R_{16}$ serves as a driver for driving the photo diode 31. A point of connection between the sixteenth circuit resistor $R_{16}$ and the twenty-third circuit transistor $Q_{23}$ is connected to a switching circuit 55 for switching reception states of receiving either the stereophonic signal or the monophonic signal from one to another. The reception state may be called a stereo reception state and a monaural reception state, respectively. In the stereo reception state, the switching circuit 55 supplies the second frequency divided signal SD (19 kHz) to the decoder 27. The decoder 27 thereby produces the right and the left channel signals. In the monaural reception state, the circuit 55 prevents the signal SD from being supplied to the decoder 27, from which the monophonic signal is thereby derived.

On reception of the monophonic signal, no pilot signal is sent from the adder circuit 41 to the second phase detector 43. In this event, the sixth circuit transistor $Q_6$ is kept at an on state while the seventh circuit transistor $Q_7$ is kept at an off state. As a result, the second phase detector 43, the cancellation circuit, and the drive circuit 53 are held inactive. The resultant photo diode 31 remains dark.

On reception of the stereophonic signal, the pilot signal of 19 kHz is supplied from the adder circuit 41 to the emitters of the first and the second circuit transistors $Q_1$ and $Q_2$ through the third and the seventh circuit resistors $R_3$ and $R_7$. Inasmuch as the first and the second circuit transistors $Q_1$ and $Q_2$ are alternately turned on and off by the pulse successions given as the third frequency divided signal TD, the filter capacitor $C_f$ is charged in accordance with a phase difference between the third frequency divided signal and the pilot signal to be kept at a voltage corresponding to the phase difference. The voltage across the filter capacitor $C_f$ continuously appears during the reception of the stereophonic signal as known in the art.

The sixth and the seventh circuit transistors $Q_6$ and $Q_7$ are kept conductive in response to the voltage developed across the filter capacitor $C_f$ and are supplied with electric currents from the first current mirror circuit of the transistors $Q_3$ through $Q_5$. The electric currents flow through the sixth and the seventh circuit transistors $Q_6$ and $Q_7$ at a ratio determined by the voltage developed across the filter capacitor $C_f$.

When the seventh circuit transistor $Q_7$ becomes conductive in the above-mentioned manner, the eighth and the ninth circuit transistors $Q_8$ and $Q_9$ are turned on and the resultant electric current is supplied to the tenth circuit transistor $Q_{10}$ of the second current mirror circuit. The resultant electric current is a d.c. current.

The eleventh circuit transistor $Q_{11}$ of the second current mirror circuit serves as a part of the wave generator 46 and allows an electric current to flow therethrough. The electric current is proportional to the resultant electric current flowing through the tenth circuit transistor $Q_{10}$ and will be called a reference current. The reference current flows through the twelfth circuit transistor $Q_{12}$ which serves as a part of each of the third and the fifth current mirror circuits. As a result, first and second electric currents $I_1$ and $I_2$ flow through the twelfth and the twentieth circuit transistors $Q_{12}$ and $Q_{20}$, respectively, and are proportional to the reference current.

The first current $I_1$ is sent to a differential amplifier comprising the fourteenth and the fifteenth circuit transistors $Q_{14}$ and $Q_{15}$ which are complementarily turned on and off in response to the pulse succession pair of the second frequency divided signal SD given from the second frequency divider 22. As a result, the first current $I_1$ alternatingly flows through the fourteenth and the fifteenth circuit transistors $Q_{14}$ and $Q_{15}$ to be delivered to the fourth current mirror circuit of the sixteenth and the seventeenth circuit transistors $Q_{16}$ and $Q_{17}$.

When the fifteenth circuit transistor $Q_{15}$ is turned on, the feedback capacitor 50 is charged at a rate determined by the first current $I_1$ through the collector of the seventeenth circuit transistor $Q_{17}$. On the other hand, the feedback capacitor 50 is discharged through the fourth current mirror circuit at a rate determined by the first current $I_1$ when the fourteenth circuit transistor $Q_{14}$ is turned on. Thus, the charge and the discharge are carried out at the same rates. Accordingly, a triangular or sawtooth wave is developed as a voltage $V_c$ across the feedback capacitor 50 and has an amplitude dependent on the first current $I_1$. The voltage $V_c$ is produced as a cancelling signal for cancelling the pilot signal.

Let a capacitor current $I_c$ flow through the feedback capacitor 50. In this event, the capacitor current $I_c$ is given by:

$$I_c = k \cdot 2\pi f \cdot C_a \cdot V_c, \tag{1}$$

where k is representative of a proportional constant and f, a frequency of 19 kHz. The voltage $V_c$ has an invariable amplitude as long as an amplitude of the pilot signal is not varied in the stereophonic signal. Therefore, the capacitor current $I_c$ has an amplitude determined by the capacitance $C_a$ of the feedback capacitor 50. This means that the capacitor current $I_c$ can be changed by varying the capacitance $C_a$.

Anyway, the cancelling signal which appears across the feedback capacitor 50 is fed back to the negative terminal of the adder circuit 41 as the local input signal LIN. From this fact, it is readily understood that the adder circuit 41, the second phase detector 43, and the cancellation circuit 45 form a negative feedback loop and serve to averagely minimize a difference between the pilot signal and the local input signal LIN. For this purpose, the first current $I_1$ is controlled in the feedback loop so that the local input signal LIN averagely approaches the pilot signal. Inasmuch as the pilot signal is given in the form of a sine wave, it is understood that the illustrated feedback loop uses the triangular wave to approximate the sine wave. It is to be noted here that the first current $I_1$ can be changed by varying the capacitance $C_a$ with this structure.

On the other hand, the wave generator 46 (FIG. 3) supplies the second current $I_2$ to the drive circuit 53 through the twentieth circuit transistor $Q_{20}$ (FIG. 4) which cooperates with the twelfth circuit transistor $Q_{12}$. The second current $I_2$ is therefore proportional to the reference current flowing through the twelfth circuit transistor $Q_{12}$ and is also proportional to the first current $I_1$.

Since the feedback capacitor 50 is charged and discharged at the rate determined by the first current $I_1$, as mentioned before, the second current $I_2$ is related to the voltage $V_c$ developed across the feedback capacitor 50.

In FIG. 4, the second current $I_2$ is converted into a drive voltage $V_0$ by the eleventh circuit resistor $R_{11}$ and the nineteenth circuit transistor $Q_{19}$. The drive voltage $V_0$ is given to the hysteresis circuit having the threshold voltage. When the drive voltage $V_0$ exceeds the threshold voltage of the hysteresis circuit, the transistors $Q_{22}$ to $Q_{25}$ become conductive to lighten the photo diode 31 connected between the fourth and the fifth circuit terminals $t_4$ and $t_5$. In addition, a voltage across the sixteenth circuit resistor $R_{16}$ is supplied to the switching circuit 55 to put the demodulator into the stereo reception state.

With this structure, the pilot signal included in the system input signal IN has an invariable amplitude in a normal one of the stereo reception state. The capacitor current $I_c$ can be changed by varying the capacitance $C_a$ and the resultant capacitor current $I_c$ results in a variation of the first and the second currents $I_1$ and $I_2$. Thus, the first and the second currents $I_1$ and $I_2$ can be controlled by the capacitance $C_a$ of the feedback capacitor 50.

It is therefore possible to vary a switching level of the switching circuit 55 even when the hysteresis circuit of the circuit transistors $Q_{21}$ to $Q_{23}$ and the circuit resistors $R_{13}$ and $R_{14}$ has a constant threshold voltage.

Figure 5:
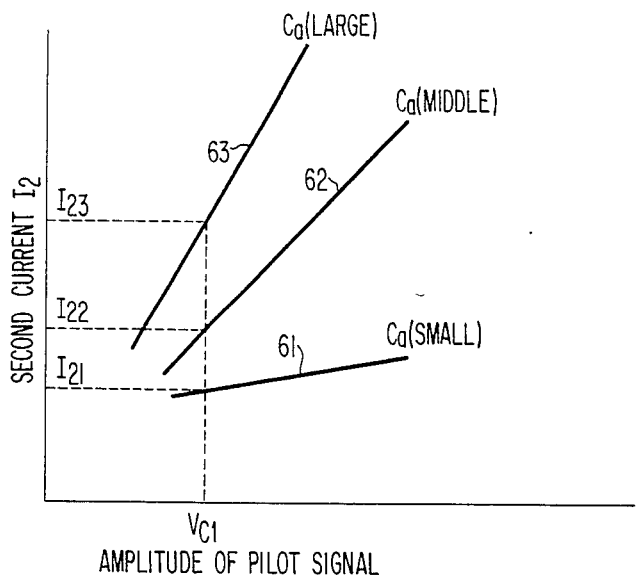
FIG. 5 shows variation of characteristics of a cancellation circuit for use in the demodulator illustrated in FIGS. 3 and 4.

Referring to FIG. 5, the level of the second current $I_2$ is successively changed with a variation of the capacitance $C_a$ of the feedback capacitor 50. When the capacitance $C_a$ is small, the level of the second current $I_2$ varies in relation to the pilot signal, as shown by a curve 61. Likewise, the level of the second current $I_2$ varies as shown by curves 62 and 63 when the capacitance $C_a$ is middle and large, respectively.

If the amplitude of the pilot signal is kept at $V_{c1}$, the capacitance $C_a$ may be selected so that the second current $I_2$ becomes equal to $I_{21}$, $I_{22}$, and $I_{23}$.

Figure 6:
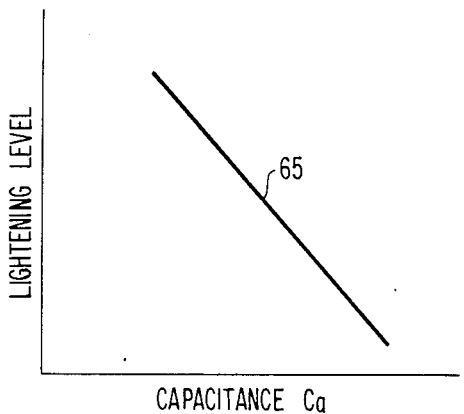
FIG. 6 shows a variation of a lightening level of a light emitting diode for use in the demodulator illustrated in FIGS. 3 and 4.

Referring to FIG. 6, a curve 65 shows a relationship between a lightening level of the photo diode 31 and the capacitance $C_a$. As is understood from the curve 65, the lightening level of the photo diode 31 decreases with an increase of the capacitance $C_a$.

Thus, operation of the photo diode 31 and the switching circuit 55 is controllable by varying the capacitance $C_a$.

It is assumed that the amplitude of the pilot signal is reduced as the field intensity becomes weak. The reduction of the pilot signal results in both of a reduction of the voltage $V_c$ across the feedback capacitor 50 and a decrease of the second current $I_2$. As a result, the drive voltage $V_0$ is lowered, which darkens the photo diode 31 and makes the switching circuit 55 switch from the stereo reception state to the monaural one.

The indicator circuit illustrated in FIG. 4 is manufactured by a semiconductor integration technique. In this event, the first through fifth circuit terminals $t_1$ to $t_5$ are formed as external terminals for connection of external elements. Anyway, the filter capacitor $C_f$, the feedback capacitor 50, the photo diode 31, and the seventeenth resistor $R_{17}$ are connected as such external elements.

Inasmuch as the cancellation circuit 45 is included in the indicator circuit 30 as mentioned above, it is possible to reduce the number of elements necessary for the demodulator. The demodulator is therefore inexpensive when manufactured by the use of the semiconductor integration technique.

While this invention has thus far been described in conjunction with a preferred embodiment thereof, it will readily be understood for those skilled in the art to put this invention into practice in various other manners. For example, the circuit input signal CIN is supplied direct to the second phase detector 43 with the intermediate signal INT sent to the multiplex decoder 27 alone. In this sense, the cancellation circuit 45 may be supplied with a signal related to the circuit input signal.

What is claimed is:

1. A demodulator for use in producing a demodulated signal in response to a circuit input signal which is one of a stereophonic signal accompanied by a pilot signal of a predetermined frequency or a monophonic signal accompanied by no pilot signal, said demodulator comprising signal producing means responsive to said circuit input signal for producing a first local frequency signal having a frequency equal to said predetermined frequency and a second local frequency signal having a frequency equal to said predetermined frequency and a phase different from a phase of said local frequency signal, wherein the improvement comprises:
   intermediate signal producing means responsive to said circuit input signal and a local input signal to generate an intermediate signal;
   demodulating means coupled to said intermediate signal producing means for demodulating said intermediate signal into said demodulated signal;
   phase detecting means coupled to said intermediate signal producing means and responsive to said second local frequency signal for detecting a phase difference between said pilot signal and said second local frequency signal on reception of said stereophonic signal;
   first circuit means coupled to said phase detecting means and responsive to said first local frequency signal for producing first and second currents dependent on said phase difference;
   second circuit means for feeding said first current back to said intermediate signal producing means as said local input signal, said second circuit means forming a negative feedback loop together with said intermediate signal producing means; and
   indicating means responsive to said second current for indicating reception of said stereophonic signal.

2. A demodulator as claimed in claim 1, wherein said first circuit means comprises:
   means coupled to said phase detecting means for producing a reference signal dependent on said phase difference;
   first current producing means responsive to said reference signal for producing said first current in proportion to said reference signal; and
   second current producing means responsive to said reference signal for producing said second current in proportion to said reference signal.

3. A demodulator as claimed in claim 2, wherein said second circuit means comprises:
   a terminal;
   a resistor connected to said terminal, said first current producing means, and said intermediate signal producing means; and
   a capacitor connected between said terminal and ground and responsive to said first current for producing a capacitor voltage thereacross, said capacitor voltage being supplied through said resistor to said intermediate signal producing means as said local input signal.

4. A demodulator as claimed in claim 3, wherein said indicating means comprises:

an indicator for optically indicating reception of said stereophonic signal; and driving means responsive to said second current for driving said indicator.

5. A demodulator as claimed in claim 4, wherein said driving means comprises:

current-to-voltage converting means for converting said second current into a drive voltage; and a drive circuit having a threshold voltage and coupled to said drive voltage converting means for driving said indicator only when said drive voltage exceeds said threshold voltage.

6. A demodulator for use in producing a demodulated signal in response to a circuit input signal which is one of a stereophonic signal accompanied by a pilot signal of a predetermined frequency of a monophonic signal accompanied by no pilot signal, said demodulator comprising signal producing means responsive to said circuit input signal for producing a first local frequency signal having a frequency equal to said predetermined frequency and a second local frequency signal having a frequency equal to said predetermined frequency and a phase different from a phase of said first local frequency signal, the improvement comprising:

an adder circuit responsive to said circuit input signal and a local input signal for producing an intermediate signal representative of a sum between said circuit input signal and said local input signal;

demodulating means coupled to said adder circuit for demodulating said intermediate signal into said demodulated signal;

phase detecting means coupled to said adder circuit and responsive to said second local frequency signal for detecting a phase difference between said pilot signal and said second local frequency signal on reception of said stereophonic signal;

means coupled to said phase detecting means for producing a reference signal dependent on said phase difference;

first current producing means responsive to said reference signal for producing a first current in proportion to said reference signal;

second current producing means responsive to said reference signal for producing a second current in proportion to said reference signal;

a resistor connected to said first current producing means, and to a negative input of said adder circuit so as to form a negative feedback loop together with said phase detecting means, said first current producing means, and said second current producing means;

a capacitor connected between said resistor and ground and responsive to said first current for producing a capacitor voltage thereacross, said capacitor voltage being supplied through said resistor to said adder circuit as said local input signal;

an indicator for optically indicating reception of said stereophonic signal; and driving means responsive to said second current for driving said indicator.

* * * * *

UNITED STATES PATENT AND TRADEMARK OFFICE
CERTIFICATE OF CORRECTION

PATENT NO. : 4,680,792

DATED : July 14, 1987

INVENTOR(S) : TANAKA ET AL

It is certified that error appears in the above-identified patent and that said Letters Patent is hereby corrected as shown below:

ABSTRACT, LINE 11   Delete "substracts" and insert --subtracts--

COLUMN 3, LINE 53   Delete "D" insert --TD--

COLUMN 10, LINE 18   After "said" insert --first--

Signed and Sealed this

Second Day of August, 1988

Attest:

DONALD J. QUIGG

*Attesting Officer*        *Commissioner of Patents and Trademarks*